United States Patent [19]
Green

[11] Patent Number: 5,509,079
[45] Date of Patent: Apr. 16, 1996

[54] BACK-MASKING EFFECT GENERATOR

[76] Inventor: Omar M. Green, 218 Harvey St., Apt. 190 1, Cambridge, Mass. 02140

[21] Appl. No.: 120,686

[22] Filed: Sep. 13, 1993

Related U.S. Application Data

[63] Continuation-in-part of Ser. No. 889,648, May 28, 1992, Pat. No. 5,245,663.

[51] Int. Cl.⁶ ..................................................... H03G 3/00
[52] U.S. Cl. .................................. 381/61; 84/606; 84/602
[58] Field of Search .......................... 381/61, 63; 84/603, 84/604, 605, 606, 602, 629; 395/425; 364/960, 960.2, 960.6, 960.7

[56] References Cited

U.S. PATENT DOCUMENTS

| | | | |
|---|---|---|---|
| 4,259,888 | 4/1981 | Gross | 84/627 |
| 4,442,745 | 4/1984 | Gross et al. | 84/607 |
| 4,655,112 | 4/1987 | Mitarai | 84/609 |
| 4,947,723 | 8/1990 | Kawashima et al. | |
| 5,090,291 | 2/1992 | Schwartz . | |
| 5,350,882 | 12/1994 | Koguchi et al. | 84/636 |

*Primary Examiner*—Curtis Kuntz
*Assistant Examiner*—Ping W. Lee
*Attorney, Agent, or Firm*—Limbach & Limbach

[57] ABSTRACT

The present invention is an audio special effect generator which simulates, almost in real time, the sound of an input audio signal being played in reverse. An input audio signal is digitized and read into memory locations in an SRAM which are sequentially addressed from zero until a predetermined address is reached at which point the data stored is read out to an output terminal in reverse order, i.e., the SRAM is addressed from the predetermined address back to zero. For each read, the data read out of the SRAM is replaced with new data from the input audio signal. When the address reaches zero again, the address begins to be incremented again as the data in each location continues to be read out to the output terminal while being replaced by data from the audio input signal. This operation continues until disabled, thus producing an audio output which is a series of audio signal packets which are copies of portions of the input audio signal reproduced in reverse.

19 Claims, 6 Drawing Sheets

BACK-MASKING EFFECT GENERATOR

RELATED APPLICATION

This application is a continuation-in-part of U.S. patent application Ser. No. 07/889,648, filed on May 28, 1992, now U.S. Pat. No. 5,245,663.

FIELD OF THE INVENTION

The invention pertains to audio signal processing equipment. More particularly, the invention pertains to an apparatus for simulating, almost in real time, the sound of an audio signal being reproduced in reverse.

BACKGROUND OF THE INVENTION

In popular music, audio sources are frequently reproduced in reverse as part of a passage in a musical piece. This effect is typically achieved by recording an audio source onto magnetic tape and then playing the tape backwards on a special tape recorder. The sound of an audio source reproduced in reverse, such as a human voice, produces an interesting and often pleasing effect within a musical piece.

More recently the effect has been achieved, particularly in rap-style music, by playing a phonograph record backwards. This is accomplished by playing a phonograph record in its normal clockwise direction and, when the effect is desired, grasping the record and pushing it in a counter-clockwise rotation momentarily so that the phonograph needle reproduces the recorded signal in reverse. This technique is commonly known as "scratching", presumably due to the type of sound produced, and is frequently used in rap-style music.

The effect of playing a sound sample in reverse cannot be accomplished in real time with the existence of the original sound source because a sound sample must first be recorded in its entirety before the sample can be reproduced in reverse. A sound cannot be reproduced, in forward or reverse, before it exists.

Further, since the advent of compact disc technology, phonograph records are becoming increasing less common. Accordingly, the availability of LP records for performing "scratching" is becoming a problem.

U.S. patent application Ser. No. 07/889,648 now U.S. Pat. No. 5,245,663, discloses a back-masking effect generator which simulates the sound of playing an audio input signal in reverse almost in real time. The device disclosed in that patent comprised two RAMs, each having associated therewith a counter, an input register and an output register. The device further comprises an analog-to-digital converter for receiving an input audio signal and providing a sampled digital output stream to the RAMs, and a digital-to-analog converter at the outputs of the RAMs for encoding analog signals from the RAM's digital contents. All of the components are controlled by a finite state machine.

In operation, at startup, a first one of the RAMs receives the digitally converted input audio data from the analog-to-digital converter and stores it incrementally in memory. When the first RAM is full, the apparatus is switched to a first one of two continuous operating states. In the first continuous operating state, the first RAM's memory is read out to the digital-to-analog converter in the reverse order from that in which it was written while simultaneously, the second RAM is incrementally filled with the output data from the analog-to-digital converter.

The two RAMs operate at the same speed so that the first RAM will be completely empty at the same time that the second RAM becomes completely filled. At that point, the device enters the second continuous operating state in which the operation is reversed so that the second RAM is emptied into the digital-to-analog converter in the reverse order from which it was filled, while the first RAM receives and incrementally stores data from the analog-to-digital converter. The finite state machine then continuously switches between the first and second continuous operation states until the device is otherwise disabled.

The device disclosed in that application, however, is inefficient in that it requires two RAMs, two counters and two sets of input and output registers.

Therefore, it is an object of the present invention to provide a back-masking effect generator which simulates the sound of playing an input audio source in reverse almost in real time utilizing only a single memory device and related hardware.

It is another object of the present invention to provide a back-masking effect generator in which the length of each packet of reverse signal is adjustable.

SUMMARY OF THE INVENTION

The invention comprises a static random access memory (SRAM) having associated therewith an input register and an output register. The device further comprises an analog-to-digital converter having an input coupled to an audio source such as a musical instrument or an audio tape source and output coupled to the input register. The device also comprises a digital-to-analog converter having an input coupled to the output of the output register and an output coupled to an audio output terminal. A counter or address register is coupled to the address inputs of the SRAM as well as to two comparators. All of the components are controlled by a finite state machine or a microprocessor.

In operation, the finite state machine or microprocessor controls the operation of the components such that after a start-up state in which the SRAM is incrementally loaded with data from the analog-to-digital converter, for each increment or decrement of the address register (or counter) data is first read out of the addressed location to the digital-to-analog converter and then read into the same location from the analog-to-digital converter.

In particular, in the start-up state of operation, data is read in from the analog-to-digital converter into the SRAM as the address register is incremented. After the address register has reached a predetermined address which is determined by one of the comparators, the apparatus enters a first continuous operation state in which the address register begins to count backwards from that address. For each decrement of the address register, (1) the data in the addressed location in the SRAM is read out to the digital-to-analog converter and (2) subsequently a new piece of data is written into the same location from the analog-to-digital converter. This operation continues until the addressed location reaches zero (as detected by the second comparator), whereupon the apparatus enters a second continuous operation state in which the counter begins to increment again. For each increment, data is read out of the addressed location to the digital-to-analog converter and, subsequently, a new piece of data is written into the SRAM from the analog-to-digital converter. This process continues until the predetermined upper end address is reached (as determined by the first comparator just as in the start-up state) The apparatus then continuously shifts between the first and second continuous operating states until it is bypassed or otherwise disabled. A window circuit is preferably provided for allowing the user to adjust the duration of each packet of data by setting the address which the first comparator compares with the location addressed by the counter.

Accordingly, the output from the digital-to-analog converter is a series of packets of audio information of a length set by the user, each package being output in the reverse order from which it was input to the SRAM. While the data comprising each packet is output in reverse, it should be understood that the packets themselves are output in the same chronological order in which they were received. Thus, assuming that the packets are selected to be one half second in duration, after a one half second delay after the enablement of the apparatus, the output of the apparatus comprises one half second packets of data being reproduced in reverse. Thus, every half second of output of the device comprises a reverse version of the immediately preceding half second audio input to the device.

The produced audio effect sounds remarkably similar to a continuous reverse audio signal such as would be obtained by playing an audio tape in reverse for an extended period of time.

DETAILED DESCRIPTION OF THE INVENTION

Structure of the Preferred Embodiment

Figure 1:
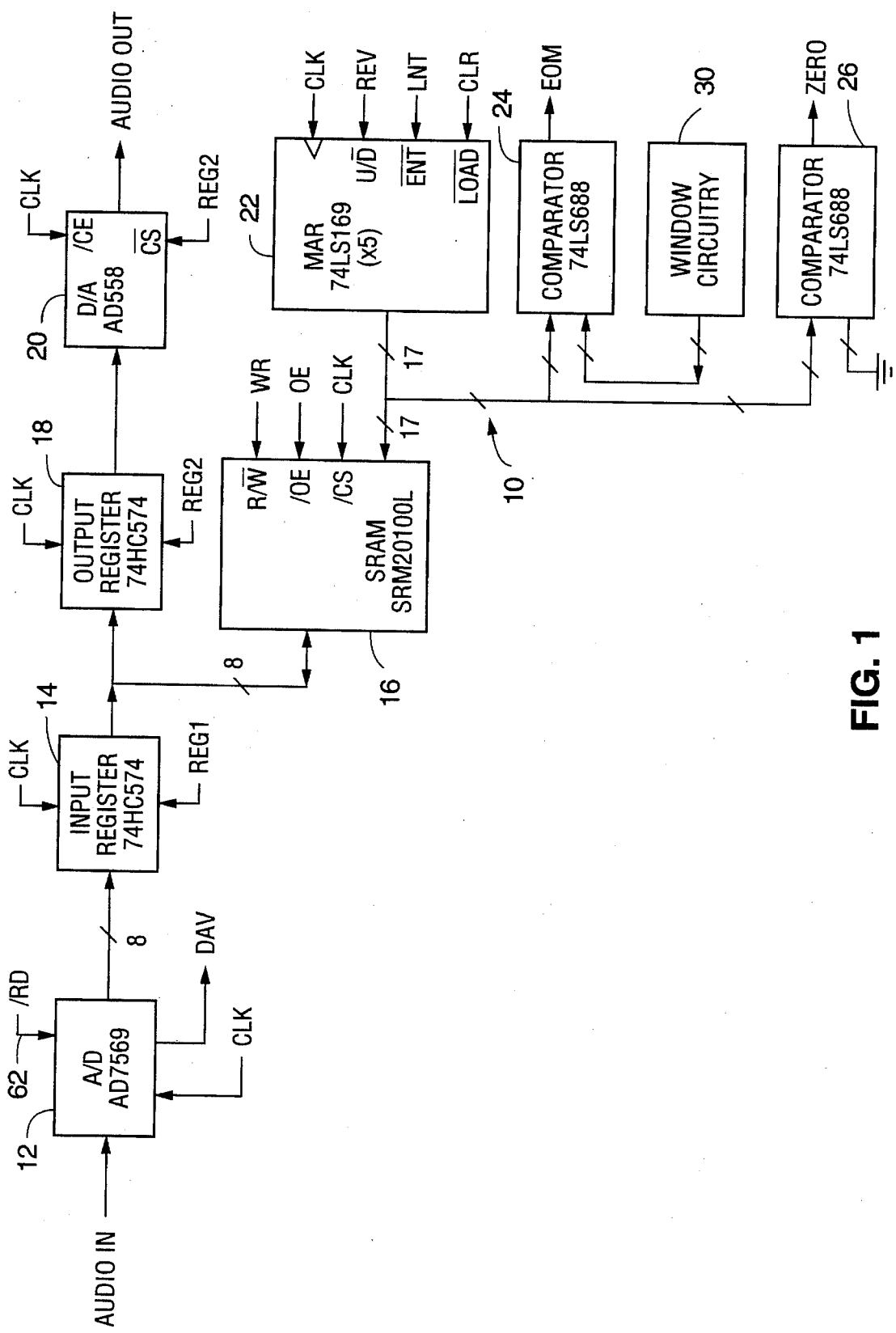
FIG. 1 is a block diagram of a preferred embodiment of the present invention.

The apparatus of a preferred embodiment of the present invention is shown in FIG. 1. The apparatus comprises an analog-to-digital converter (A/D) 12 having its analog data input coupled to the audio input of the apparatus. The output of the A/D 12 is coupled to the input of an input register 14. The output of input register 14 is coupled both to the input of an output register 18 and the data in/out lines of an static random access memory (SRAM) 16. The output of the output register 18 is coupled to the digital input terminal of a digital-to-analog converter (D/A) 20. The output of D/A 20 is coupled to the audio output terminal of the apparatus. Addressing of the SRAM is accomplished by a counter or memory address register (MAR) 22. The apparatus further comprises two comparator circuits 24 and 26 which compare the address output of MAR 22 with predetermined addresses. In the preferred embodiment, comparator 26 compares the address with zero and comparator 24 compares the address with an address determined by a window circuit. The window circuit is a user interface circuit which allows the user to select the particular address which comparator 24 compares with the output address of the MAR 22.

In one particular preferred implementation, the A/D 12 is an Analog Devices, Inc. AD7569, The D/A 20 is an Analog Devices, Inc. AD558, the input and output registers each is a Texas Instruments, Inc. 74HC574, the SRAM is a Mitsubishi SRM20100L and the memory address register (MAR) comprises five Texas Instruments, Inc. 74LS169 chips. In the preferred embodiment, the SRAM contains 128K addressable 8 bit wide storage locations and, therefore, is addressable with seventeen address bits. Accordingly, the MAR 22 comprises five of the four bit wide 74LS169s configured in a nested arrangement. The comparators each may be a Texas Instruments, Inc. 74LS688. A finite state machine controls the operation of the components.

As will be described in greater detail hereinafter, when the back-masking effect is operating, the memory locations in the SRAM are sequentially addressed from zero through a specified address (hereinafter termed the end of memory or EOM address) and then sequentially from the EOM address back to zero. Accordingly, comparators 24 and 26 compare the address with the EOM address and zero, respectively, to determine when either of these addresses is reached. When one of the comparators detects a match, the MAR 22 is instructed to reverse the order of sequential addressing Window circuit 30 is an input circuit which allows an operator to select the EOM address, as will be explained in greater in detail hereinafter.

Figure 2:
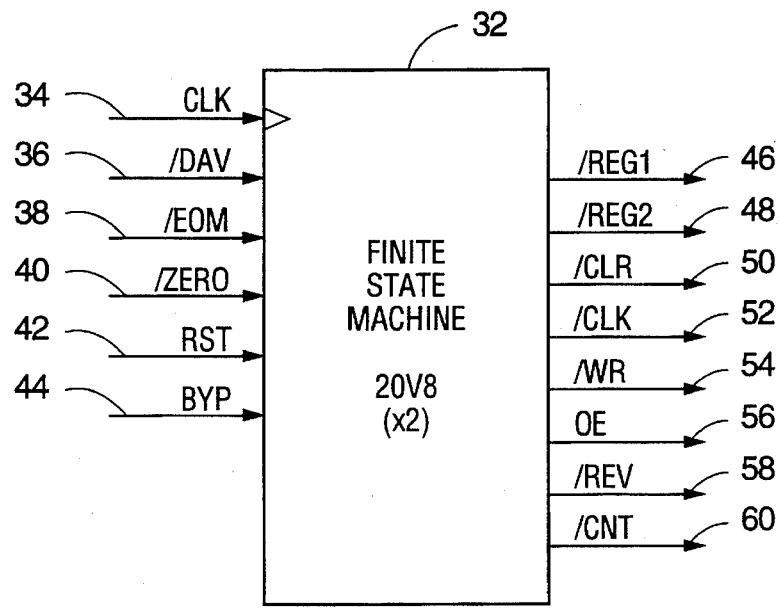
FIG. 2 is a diagram showing the inputs and outputs of a finite state machine for controlling the operation of the apparatus shown in FIG. 1.

FIG. 2 shows a finite state machine (FSM) 32 which controls the elements shown in FIG. 1. The FSM 32 has six inputs and eight outputs which are used in the preferred embodiment shown in FIG. 1. The FSM receives the clock input at terminal 34. It also receives the data available input from A/D 12 at terminal 36. At terminal 38, it receives an end of memory signal from comparator 24 which is asserted low when comparator 24 detects a match between the address from MAR 22 and the EOM address from window circuit 30. At terminal 40, the FSM receives the zero signal from comparator 26 which is asserted low when the address from MAR 22 reaches zero. Finally, at terminals 42 and 44, the FSM receives a reset signal and a bypass signal, respectively. Both reset and bypass can be asserted by the operator of the apparatus of the present invention through push buttons or the like. Reset allows the operator to reset the back-masking effect while bypass allows the operator to disable the back-masking effect.

Outputs 46 through 60 of FSM 32 control the operation of the circuit of FIG. 1 responsive to the inputs 34–44. Outputs 46 and 48, REG1 and REG2, respectively, control the input and output registers. Clear line 50 is coupled to the load terminal of MAR 22 and is asserted only when the reset button is pressed. In response to the clear line 50 being asserted low, MAR 22 reinitializes to the zero address. Output 52 is simply the inverse of the clock input at terminal 34. The inverted clock controls MAR 22 whereas the noninverted clock controls all other components. This allows the reverse line to stabilize before a count pulse is delivered on the MAR, either to increment or decrement. Output 54 is provided to the read/write input of SRAM 16 and instructs SRAM 16 whether to read or write data on the next clock pulse. OE output 56 is coupled to the output enable input of the SRAM 16 and essentially disables the SRAM when high. Reverse output 58 is simply an instruction to the up/down input of MAR 22 and, when high, instructs MAR 22 to increment the counter on the next count pulse and, when low, instructs MAR 22 to decrement on the next count pulse. Finally, count line 60 is the count instruction (asserted low) to MAR 22 and is essentially asserted every time the data available input 36 becomes asserted except, as will be explained more fully herein, when either the bottom or top address as may be specified by an operator of the apparatus is reached.

The RD input 62 to A/D 12 causes the A/D to convert a sample when asserted and is coupled to a pulse train running at 1/16th the speed of the clock. In the preferred embodiment, the clock runs at 819.2 KHz and thus the A/D samples at a rate of 51.2 KHz.

Operation of the Preferred Embodiment

The apparatus as illustrated in FIGS. 1 and 2 basically has four states of operation. The simplest state is the bypass state in which the back-masking effect is bypassed. When the bypass input 44 to FSM 32 is asserted, output enable signal 56 is set to disable SRAM 32 and the REG1 and REG2 output signals 46 and 48 of FSM 32 are controlled responsive to the data available input 36 from the A/D 12 to simply pass data from the audio input terminal through A/D 12, input register 14, output register 18, and D/A 20. SRAM 16 is disabled so as to prevent any data on its data input/output lines from interfering with the data being passed between input register 14 and output register 18.

When the back-masking effect is enabled (or the reset button is depressed), the device enters its start-up state of operation. In this state, the digital samples from A/D 12 are passed to input register 14 and output therefrom both to output register 18 and into SRAM 16. Output register 18 passes the data to D/A 20 such that during the start-up state, the input audio signal is passed from the audio input terminal to the audio output terminal through the A/D, input and output registers, and the D/A. Simultaneously, however, each piece of digital data is also being stored in consecutively incremented storage locations in SRAM 16 under the addressing of MAR 22. The start-up state lasts until comparator 24 detects a match between the address output by MAR 22 and the EOM address which it receives from window circuitry 30.

When comparator 24 detects a match, it asserts low its EOM output to the FSM 32 which then causes the apparatus to enter a first continuous operating state. At this point, FSM 32 inverts its reverse line so that MAR 22 will now start decrementing from the EOM address. In this state of operation, FSM 32 controls A/D 12, input register 14, output register 18, D/A 20, SRAM 16 and MAR 22 as follows: for every data available pulse 36 received from A/D 12, SRAM 16 reads data out to D/A 20 through output register 18 and then writes data into the same memory location from A/D 12 through input register 14. The MAR 22 is then decremented and the process is repeated until the address from MAR 22 reaches zero. At that point, comparator 26 will detect a match between the address output by MAR 22 and its second input which is tied to ground and will assert low its zero output. Upon receiving the low asserted zero output at terminal 40, FSM 32 will then enter a second continuous operating state. The second continuous operating state is essentially identical to the first continuous operating state except that reverse line 58 is inverted so that MAR 22 now counts upward until it reaches the EOM address whereupon, responsive to the EOM signal from comparator 24, the FSM will switch back to the first continuous operating state. The apparatus will continue to switch between the first and second operating states until reset, bypassed or turned off.

In accordance with the above-described operation of the device, the audio out signal comprises a series of data packets, each data packet comprising a finite period of the audio input signal reproduced in reverse. The data packets themselves, however, are reproduced in the order in which they were received. In other words, although each packet comprises the input signal reproduced in reverse, the packets are reproduced in the order in which they were received such that the first packet comprises a first period of the input signal reproduced in reverse, the second packet comprises a second period of the input signal reproduced in reverse, the third packet comprises a third period of the input signal reproduced in reverse and so on. The packets are played continuously without interruption and, therefore, the human ear does not perceive any disruption in the output sound. Further, although the input audio signal is not actually being reproduced in reverse from end to beginning, but is rather being reproduced in reverse in small packets, the sound typically is substantially similar to the sound which would be created by playing the input audio signal in reverse on a reversible audio tape deck.

The duration of the packets is dictated by the sampling rate of the A/D and D/A converters and the end of memory address selected by the operator. In the preferred embodiment, the sampling rate is 51.2 kHz and the operator can select the duration of the packets anywhere from zero to 2.55 seconds in increments of 1/100 of a second. At 51.2 kHz only the eight most significant bits (MSBs) of the SRAM address (bit positions 17–10) are used by the comparators (since $2^9$ samples are taken every 1/100 of a second). Accordingly, in the preferred embodiment, only the eight MSBs of the address are supplied to comparator circuits 24 and 26. In the particular embodiment described above, the first $2^9$ memory locations in SRAM 16 are written to during the startup state but are never read out of the SRAM during the first or second continuous operating stages. In most instances, this will be insignificant. However, if it is of significance, then the apparatus can be modified by having the comparators 24 and 26 simply utilize all bits of the address from MAR 22.

Figure 3:
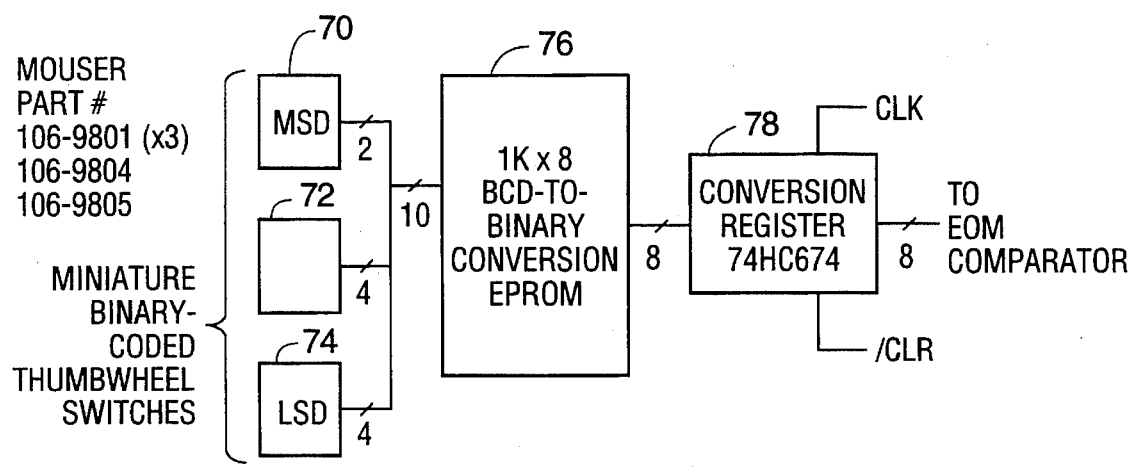
FIG. 3 is a block diagram of a preferred embodiment of the window circuit shown in FIG. 1.

In the preferred embodiment, the EOM address is selectable by the operator through a window circuit 30. FIG. 3 shows one possible embodiment of window circuit 30. In this embodiment, the user is provided with three miniature, binary-coded-decimal thumb wheel switches 70, 72 and 74. The least significant digit thumb wheel 74 controls the duration by hundredths of a second, the middle thumb wheel 72 controls the duration by tenths of a second, and the most significant digit thumb wheel 70 controls the duration by seconds. In the preferred embodiment, the user can select a maximum of 2.55 seconds packet duration. Accordingly, only the two LSBs of the most significant digit thumb wheel switch 70 are used while all four bits of thumb wheel switches 72 and 74 are utilized. The ten bits from the switches 70, 72 and 74 are presented to BCD-to-binary conversion EPROM 76 where they are converted to binary through the use of a look-up table.

Figure 4A:
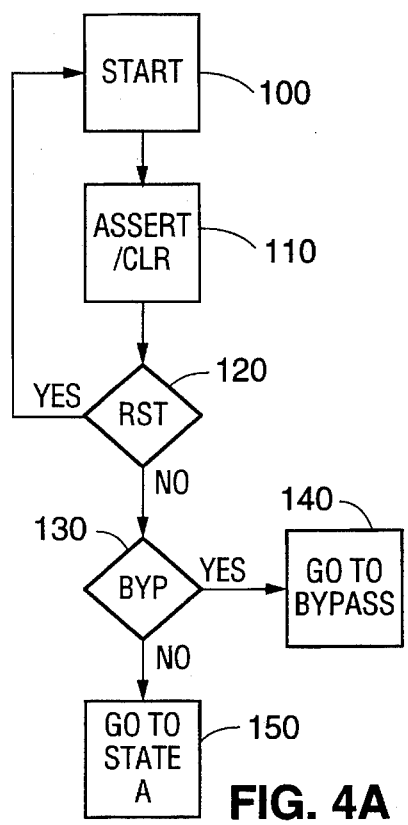
FIGS. 4A–4N are flow charts illustrating the operation of the apparatus of the present invention.
Figure 4B:
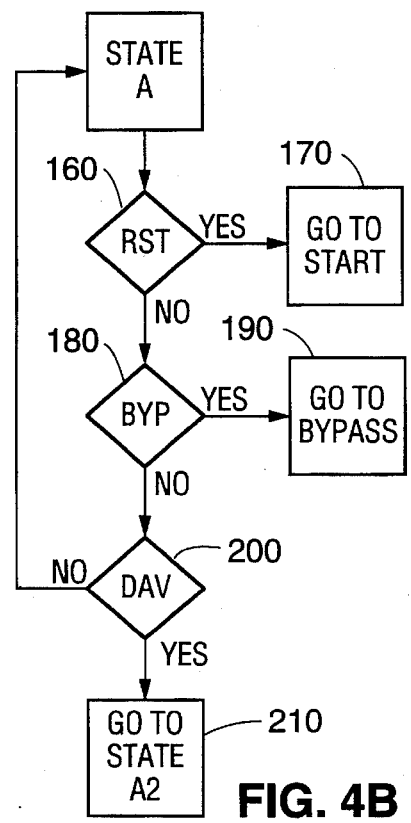
Figure 4C:
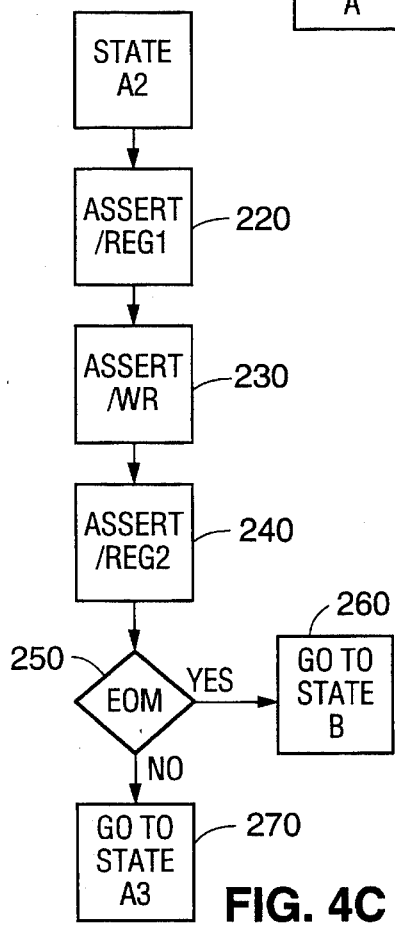
Figure 4D:
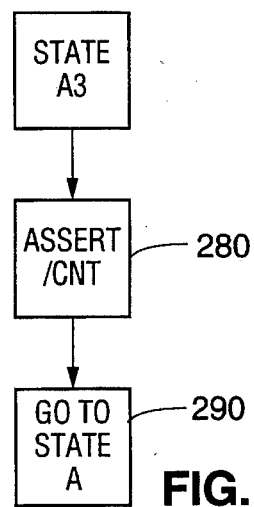
Figure 4E:
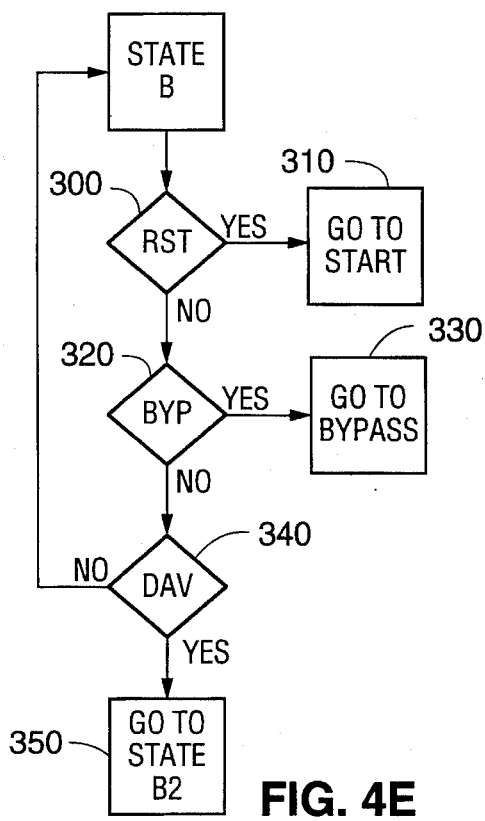
Figure 4F:
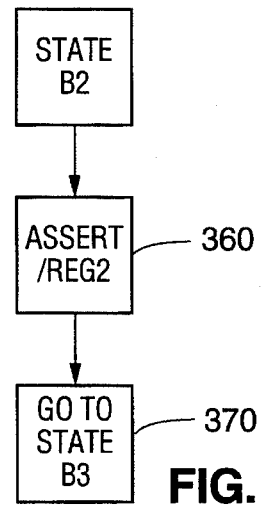
Figure 4G:
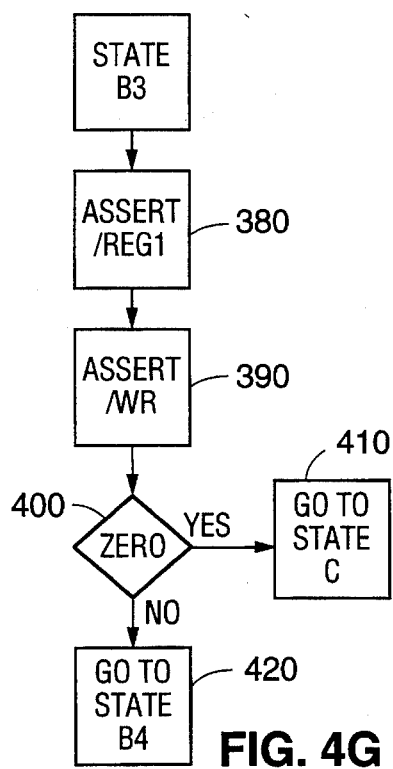
Figure 4H:
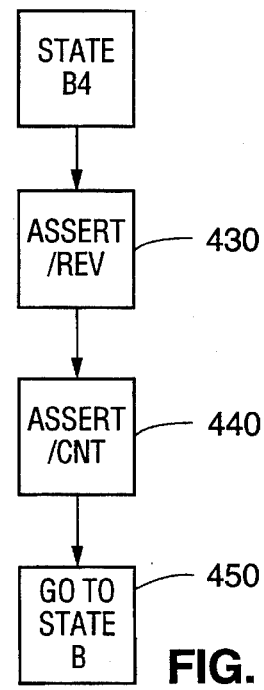
Figure 4I:
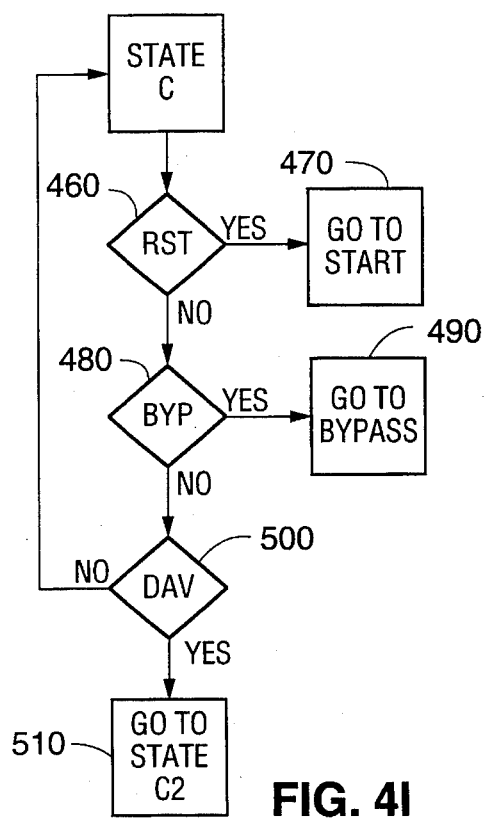
Figure 4J:
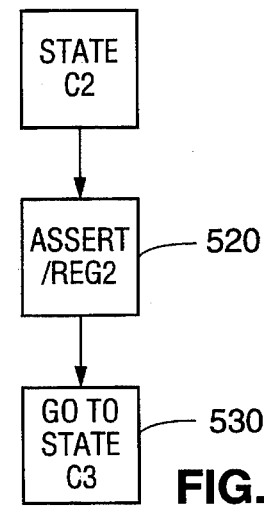
Figure 4K:
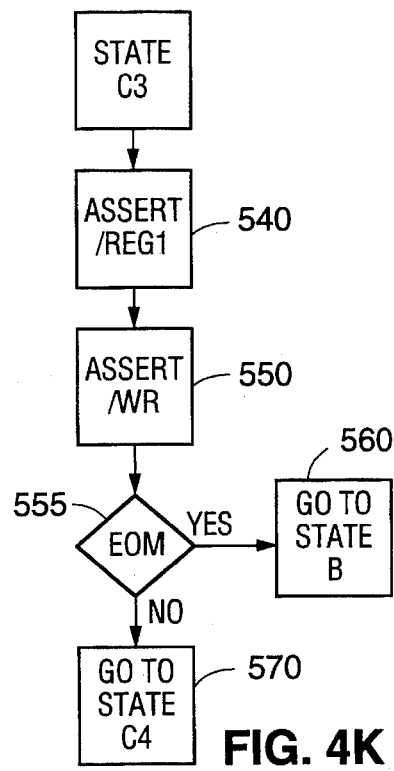
Figure 4L:
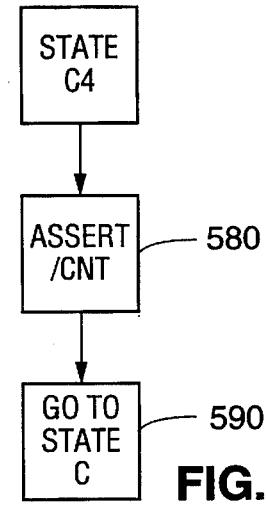
Figure 4M:
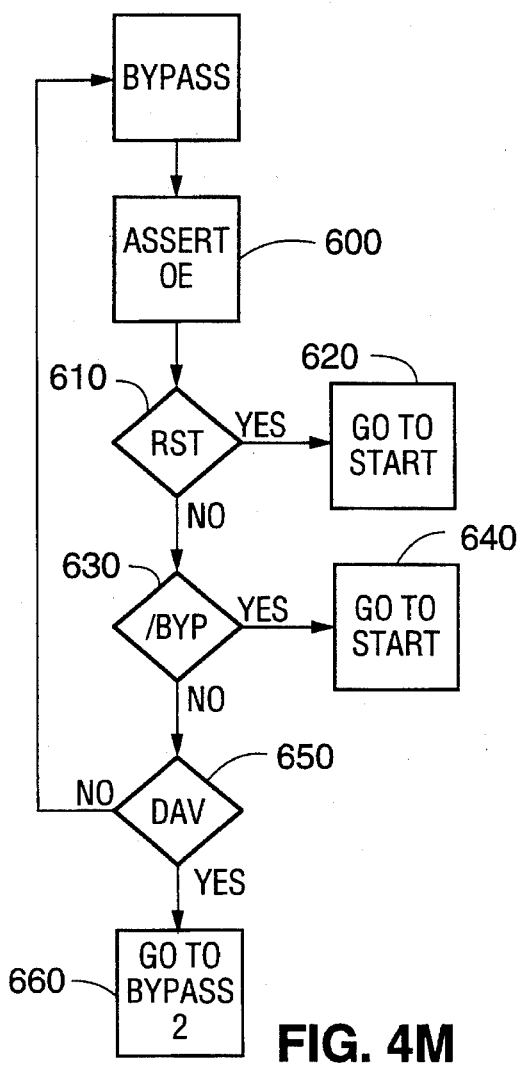
Figure 4N:
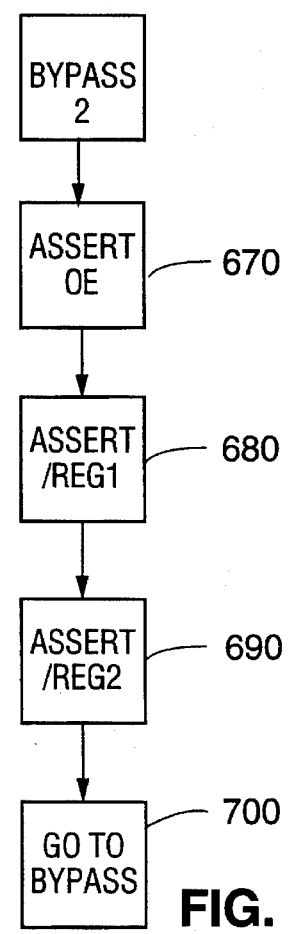

A conversion register 78 forwards the EOM address to comparator 24 when the clear line goes low. FIGS. 4A–4N are flow charts illustrating the operation of the present invention as described above. In FIGS. 4A–4N, the previously referred to startup state is labelled state A, the first continuous operating state is labelled state B, the second continuous state is labelled state C and the bypass state is labelled bypass. The flow charts in FIGS. 4A–4N contain sub-state labels such as A1, A2, B1, B2 for convenient reference but do not necessarily constitute separate states as used in this description.

Referring to FIG. 4A, operation starts at step 100. In step 110, the FSM 32 asserts the clear line which initializes the MAR 22 at address zero and causes the EOM address from the window circuitry to be latched into comparator 24. In step 120, if the reset button has been depressed, flow returns to step 100. Otherwise, flow continues to step 130 where, if the bypass button has been depressed, programming flows to step 140 and enters a bypass state to be discussed later. If neither the reset or bypass buttons have been depressed, programming flows to the start-up state.

In state A, if the reset button or bypass button has been depressed, operation returns to start or the bypass state, respectively (steps 160, 170, 180 and 190). If not, in step 200, the device waits for the data available line to be asserted by A/D 12. When data becomes available, operation flows to A2 (step 210). In A2, the FSM asserts the REG1 line which causes the input register to latch the data available at the output of the A/D 12 (step 220). It then asserts the write pulse (low) instructing the SRAM to write the data at its data inputs into the memory location addressed by MAR 22 (step 230). In step 240, REG2 also is asserted. Accordingly, the data is written directly from the input register 14 to the output register 18 simultaneously with being written into the SRAM 16. In step 250, if the end of memory address has been detected by comparator 24, programming flows to state B, the first continuous operating state (step 260). Otherwise, operation flows to A3 (step 270). In A3, the address output of the MAR is incremented (step 280) and flow returns to the beginning of state A.

When the end of memory address eventually is detected in step 250, operation flows to the first continuous operating state (state B) where initially the reset and bypass buttons are checked (steps 300, 310, 320 and 330). If neither the reset nor the bypass buttons have been depressed, in step 340, the apparatus waits for the A/D 12 to assert the data available line. When it is asserted, operation flows to B2 where, in step 360, the output register 18 is enabled to latch the data appearing at its input and feed the data to the D/A. This data is the last piece of data read in from the A/D 12 before the device entered the first continuous operating state. Operation then flows to B3. In B3, REG1 is asserted (step 380) so that another piece of data is latched into the input register 14 from A/D 12. In step 390, the write line is asserted (low) so that the new piece of data from the A/D 12 is written into SRAM 16, into the EOM address in the SRAM.

Step 400 describes the operation of comparator 26. If the address output by MAR 22 is zero, operation flows to state C, i.e., the second continuous operating state, (step 410). If not, operation flows to B4 (step 420). In step 430, the reverse line is asserted so that MAR 22 will now decrement the counter on each count pulse. In step 440, the count line is asserted to cause a decrement and operation then returns to the beginning of state B (step 450). When the zero address is finally reached (step 400), the FSM enters state C, the second continuous operating state (step 410). In state C, if the reset or bypass buttons are depressed, operation flows as previously described (steps 460, 470, 480 and 490). If neither button has been depressed, in step 500, the FSM waits for the data available line to be asserted by A/D. When it is asserted, programming flows to C2 (step 510). In C2, the output register is enabled (step 520), reading data from the zeroeth location into the D/A 20, and operation flows to C3 (step 530). In C3, the input register is enabled (step 540) and the new data from the A/D is written into the SRAM (step 550) in the same memory location from which the data had just been read out to the D/A. In step 555, when comparator 24 detects the end of memory address, flow returns to state B, i.e., the first continuous operating state, (step 560). If the end of memory address is not detected, however, operation flows to C4 (step 570). In C4, the MAR address is incremented (step 580) and programming returns to the beginning of state C (step 590).

If and when the bypass button is depressed and detected in any of the previously described steps in which the bypass button is checked, operation flows to step 600 in which FSM 32 controls the output enable signal to SRAM 22 to turn SRAM 22 off. In step 610, if the reset button is depressed, operation flows back to the start-up state (step 620). In step 630, when the bypass button is released, operation is also sent back to the start state (640). However, as long as the bypass button is depressed, the device will wait for the data available input to be asserted (step 650) and, when asserted, operation will continue on to bypass 2 (step 660). In bypass 2, the output enable signal is asserted, thus turning SRAM 16 off (step 670) and both the input and output registers are enabled (steps 680 and 690) so that data will pass through the system unchanged. Programming will then continue looping around in the bypass state (step 700) until the bypass button is released.

Having thus described a few particular embodiments of the invention, various alterations, modifications and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

What is claimed is:

1. An apparatus for simulating the sound of an audio input signal reproduced in reverse comprising:

a memory storage device comprising a plurality of memory locations for storing data;

address means for generating addresses for addressing said memory locations in said memory storage device, input coupling means for coupling said audio input signal to said memory storage device, output coupling means for coupling said memory storage device to an audio output terminal, and means for controlling data flow in said apparatus by switching between at least first and second operating states in which, in said first operating state, (1) a sample of said data is read out of a memory location in said memory storage device specified by said addressing means to said output coupling means, (2) another sample of said data is then written into said same memory location from said input coupling means, and (3) subsequently, the address specified by said addressing means is incremented, said operation being repeated until a first predetermined address is reached, whereupon said apparatus is switched to said second operating state, in said second operating state, (1) a sample of said data is read out of a memory location in said memory storage device specified by said addressing means to said output coupling means, (2) another sample of said data is written into said same memory location from said input coupling means, and (3) subsequently, the address specified by said addressing means is decremented, said operation being repeated until a second predetermined address is reached, whereupon said apparatus is switched to said first operating state.

2. An apparatus as set forth in claim 1 wherein said input means comprises an analog-to-digital converter and said output means comprises a digital-to-analog converter.

3. An apparatus as set forth in claim 2 wherein said input means further comprises an input register coupled between said analog-to-digital converter and said memory storage device and said output means further comprises an output register coupled between said memory storage device and said digital-to-analog converter.

4. An apparatus as set forth in claim 1 wherein said means for controlling data flow comprises a finite state machine.

5. An apparatus as set forth in claim 1 wherein said means for controlling data flow comprises a microprocessor.

6. An apparatus as set forth in claim 1 wherein said means for addressing said memory storage device comprises a memory address register.

7. An apparatus as set forth in claim 1 wherein said memory storage device comprises a static random access memory.

8. An apparatus as set forth in claim 7 further comprising switch means by which an operator of said apparatus can select said first predetermined address.

9. An apparatus as set forth in claim 8 further comprising first and second comparators and wherein at least a portion of said address generated by said addressing means is applied to a first input of each of said comparators and said first and second predetermined addresses are applied to a second input of said first and second comparators, respectively, and wherein said means for controlling data flow switches from said first state to said second state when a match is detected by said first comparator and switches from said second state to said first state when a match is detected by said second comparator.

10. An apparatus for simulating the sound of an audio input signal in reverse comprising:
   an analog-to-digital converter having an input coupled to said audio input signal and a digital output terminal,
   a memory storage device having a plurality of addressable memory locations for storing data, a data input terminal and a data output terminal, said data input terminal being coupled to said digital output terminal of said analog-to-digital converter,
   an address register for addressing said memory storage device,
   a digital-to-analog converter having an input coupled to said data output terminal of said memory storage device and an output coupled to an audio output terminal of said apparatus, and means for controlling data flow in said apparatus by switching between at least first and second operating states in which,
   in said first operating state, (1) a sample of said data is read out of a memory location in said memory storage device generated by said address register to said digital-to-analog converter, (2) another sample of said data is then written into said same memory location from said analog-to-digital converter, and (3) subsequently, the address generated by said address register is incremented, said operation being repeated until a first predetermined address is reached, whereupon said apparatus is switched to said second operating state,
   in said second operating state, (1) another sample of said data is read out of a memory location in said memory storage device generated by said address register to said digital-to-analog converter, (2) another sample of said data is then written into said same memory location from said analog-to-digital converter, and (3) subsequently, the address generated by said address register is decremented, said operation being repeated until a second predetermined address is reached, whereupon said apparatus is switched to said first operating state.

11. An apparatus as set forth in claim 10 further comprising an input register coupled between said analog-to-digital converter and said memory storage device and an output register coupled between said memory storage device and said digital-to-analog converter.

12. An apparatus as set forth in claim 11 wherein said input register is also coupled to said output register and said data flow control means also has a third state in which (1) a sample of said data is written from said analog-to-digital converter into the memory location generated by said address register, (2) said sample of data is latched into said output register from said input register wherein it is passed to said digital-to-analog converter, and (3) subsequently, the address generated by said address register is incremented, said operation being repeated until said first predetermined address is reached, whereupon said apparatus is switched to said second operating state.

13. An apparatus as set forth in claim 12 further comprising first and second comparators and wherein at least a portion of said address determined by said address register is applied to a first input of each of said comparators and said first and second predetermined addresses are applied to a second input of said first and second comparators, respectively, and wherein said data flow control means switches from said first operating state and said third operating state to said second operating state when a match is detected by said first comparator and switches from said second operating state to said first operating state when a match is detected by said second comparator.

14. An apparatus as set forth in claim 13 wherein said data flow control means first enters said third state and thereafter switches between said second and first states until disabled.

15. An apparatus as set forth in claim 14 wherein said data flow control means further has a bypass state which can be selected by an operator in which state said memory storage device is disabled and said output of said input register is coupled to said output register such that said input audio signal is passed through said apparatus to be reproduced without reversal.

16. An apparatus as set forth in claim 15 further comprising switch means by which an operator of said apparatus can select said first predetermined address.

17. A method for simulating the sound of an input audio signal being reproduced in reverse, comprising the steps of:
   (1) continuously converting said input audio signal to digital data as it is being received, said digital data comprising a plurality of data points, each data point comprising a representation of said input audio signal at an instant in time,
   (2) entering a first state comprising the step of storing said data points in a predetermined number of memory locations,
   (3) when all of said predetermined number of memory locations are filled with said data points, entering a second state comprising the steps of;
      (a) reading said data points out of said memory locations in the opposite order in which they were stored,
      (b) converting each data point read out during step (3a) into an analog signal and providing it to an audio terminal before the next data point is read out of the next memory location,
      (c) for each memory location from which one of said data points was read out in step (3a), storing in said same memory location, before the next data point is read out of the next memory location, one of said data points from said audio input signal,
   (4) after a last one of said data points is stored in step (3c), entering a third state comprising the steps of,
      (a) reading said data points stored during step (3c) out of said memory locations in the opposite order in which they were store, (b) converting each data point read out during step (4a) into an analog signal before the next data point is read out of the next memory location, (c) for each data point read out of a memory location during step (4a), storing in said same memory location, before the next data point is read out of the next memory location, a data point from said audio input signal, and (5) repeating steps (3) through (4).

18. A method as set forth in claim 17 further comprising the step of converting each data point stored in step (2) into an analog signal and providing it to said audio output terminal simultaneously with said storing operation.

19. An apparatus for simulating the sound of an audio input signal reproduced in reverse comprising:

a memory storage device comprising a plurality of memory location, addressing means for addressing said memory locations in said memory storage device, input coupling means for coupling said audio input signal to said memory storage device, output coupling means for coupling said memory storage device to an audio output terminal, and means for controlling data flow in said apparatus by switching between at least first and second operating states in which, in said first operating state, (1) a sample of said data is read out of a memory location in said memory storage device specified by said addressing means to said output coupling means, (2) another sample of said data is then written into said same memory location from said audio input signal, and (3) subsequently, the address specified by said addressing means is changed, said operation being repeated for a different memory location, said address being changed in a predetermined order so that no memory location is accessed twice in said first state, until a first predetermined address is reached, whereupon said apparatus is switched to said second operating state, in said second operating state, (1) a sample of said data is read out of a memory location in said memory storage device specified by said addressing means to said output coupling means, (2) another sample of said data is then written into said same memory location from said audio input signal, and (3) subsequently, the address specified by said addressing means is changed, said operation being repeated for a different memory location, said address being changed in the reverse order of said predetermined order until the first address accessed in the first operating state is reached, whereupon said apparatus is switched to said first operating state.

* * * * *